(12) United States Patent
Lim et al.

(10) Patent No.: US 6,845,049 B2
(45) Date of Patent: Jan. 18, 2005

(54) SEMICONDUCTOR MEMORY DEVICE INCLUDING A DELAYING CIRCUIT CAPABLE OF GENERATING A DELAYED SIGNAL WITH A SUBSTANTIALLY CONSTANT DELAY TIME

(75) Inventors: Kyu-Nam Lim, Gyeonggi-do (KR); Jei-Hwan Yoo, Gyeonggi-do (KR); Young-Gu Kang, Gyeonggi-do (KR); Jong-Won Lee, Seoul (KR); Jae-Yoon Shim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 211 days.

(21) Appl. No.: 10/313,817

(22) Filed: Dec. 5, 2002

(65) Prior Publication Data

US 2003/0128598 A1 Jul. 10, 2003

(30) Foreign Application Priority Data

Jan. 9, 2002 (KR) ................................ 10-2002-0001262

(51) Int. Cl.[7] .................................................. G11C 7/00
(52) U.S. Cl. .......................... 365/194; 365/196; 365/210
(58) Field of Search ................................. 365/194, 195, 365/196, 201, 210

(56) References Cited

U.S. PATENT DOCUMENTS 5,465,232 A    11/1995  Ong et al.
6,285,604 B1 *  9/2001  Chang ........................ 365/200
6,577,548 B1 *  6/2003  Barth et al. ................. 365/210

* cited by examiner

Primary Examiner—Richard Elms
Assistant Examiner—Toan Le
(74) Attorney, Agent, or Firm—Marger Johnson & McCollom

(57) ABSTRACT

A semiconductor memory device with a bit line sense enable signal generating circuit is disclosed. The semiconductor memory device includes a word line selection signal generating circuit for generating a word line selection signal for selecting a word line; a delay circuit for generating a delayed signal by delaying a signal to the same extent of time period which is needed for the word line selection signal generating circuit to generate the word line selection signal; and a Schmitt trigger for generating a word line enable detecting signal by receiving an output signal from the delay circuit and that is connected to a power supply voltage which has the same voltage level as the voltage level used to enable the word line. The bit line sense enable signal generating circuit in the present invention occupies a relatively smaller layout area than that of conventional semiconductor memory devices. Furthermore, the generating circuit generates a bit line sense enable signal with constant delay time that is immune from process changes, voltage fluctuations, and temperature fluctuations.

6 Claims, 3 Drawing Sheets

SEMICONDUCTOR MEMORY DEVICE INCLUDING A DELAYING CIRCUIT CAPABLE OF GENERATING A DELAYED SIGNAL WITH A SUBSTANTIALLY CONSTANT DELAY TIME

This patent application claims foreign priority under 35 U.S.C. §119 to Korean Patent Application No. 2002-1262, filed on Jan. 9, 2002, which is hereby incorporated by reference in its entirety.

BACKGROUND OF THE INVENTION

1. Field of the Invention

The present invention relates to a semiconductor memory device including a delaying circuit such as a bit line sense enable signal generating circuit, in particular to a semiconductor memory device capable of generating a bit line sense enable signal with a constant delay time.

2. Description of Related Art

In a conventional semiconductor memory device, a bit line sense enable signal generating circuit (generating circuit) is designed to include a delaying circuit comprised of resistors, capacitors and inverters. Operation of the delaying circuit is generally affected by process changes or voltage and temperature fluctuations. Accordingly, the timing delay in the bit line sense enable signal (signal) produced by the conventional generating circuit varies based on the voltage and the temperature fluctuations and the process changes.

For example, a signal with a relatively short delay time is generated by the generating circuit when the semiconductor memory device is operated at a relatively lower temperature and/or a greater operation voltage. On the contrary, a signal with a relatively long delay time is generated when the semiconductor memory device is operated at a relatively higher temperature and/or a lower operation voltage.

Accordingly, conventional semiconductor memory devices are configured to operate in response to the longest delay time produced by the generating circuit. This kind of design allows the signal to punctually amplify data transferred by a pair of bit lines without erroneous operation even if the signal is delayed from the desired time. However, the conventional generating circuit described above forces operation speed such as the data input/output time of the semiconductor memory device to become slower because the semiconductor memory device is operated in response to the longest delay time.

A study for solving the problem of the conventional semiconductor memory device is disclosed in U.S. Pat. No. 5,465,232 issued to Ong et al. (Ong). The semiconductor memory device in Ong includes a circuit for selecting a dummy sub-word line wherein the circuit is formed at a peripheral circuit area and has the same circuit configuration as a circuit for selecting a sub-word line in the memory cell array. Accordingly, the dummy sub-word line is selected at the same time when the sub-word line in the memory cell array is selected, and then a signal is generated automatically after a predetermined delay time from when the selected sub-word line is enabled. Therefore, the signal can be generated without depending on process changes or voltage and temperature fluctuations because resistors and capacitors are not included in the circuit for generating the signal.

However, the semiconductor memory device described by Ong still has the drawback that the circuit for automatically generating the signal dominates a large layout area of a semiconductor substrate, so much so that the chip size of the semiconductor memory device should be increased. Furthermore, the circuit for automatically generating the signal has to be repeatedly tested to confirm whether the circuit satisfies desired characteristics. The testing operation consumes productive time of the semiconductor memory device, decreasing the throughput of the semiconductor memory device.

BRIEF SUMMARY OF THE INVENTION

To overcome the problems described above, preferred embodiments of the present invention provide a semiconductor memory device including a delaying circuit for generating a delayed signal with a constant delay time without depending on process changes and voltage or temperature fluctuations. A delaying circuit in accordance with the present invention does not require additional layout area in comparison with the conventional delaying circuit.

In accordance with one aspect of the present invention, there is provided a semiconductor memory device comprising: a word line selection signal generating circuit for selecting a word line; a delaying circuit for generating a delayed signal by delaying a signal to the extent of a constant time; and a Schmitt trigger generating a word line enable detecting signal by receiving an output signal output from the delaying circuit, the Schmitt trigger being connected to a power-supply voltage which is the same as the voltage level that enables the word line.

In accordance with another aspect of the present invention, there is provided a semiconductor memory device, comprising: a memory cell array having a plurality of memory cells which are connected between a plurality of word lines and a plurality of bit line pairs; a decoding means for decoding a row address in response to an active command; a word line selection means for selecting a word line out of the plurality of word lines in response to an output signal from the decoding means; a dummy word line selection means for selecting a dummy word line having substantially the same capacitance as the word line in response to the output signal from the decoding means, wherein the dummy word line selection means has substantially the same circuit configuration as the word line selection means; a Schmitt trigger for generating a word line enable detecting signal by receiving a signal from the selected dummy word line, wherein the Schmitt trigger is connected to a power supply voltage which is the same as the voltage level to enable the word line.

In accordance with further another aspect of the present invention, there is provided a semiconductor memory device, comprising: a memory cell array including a plurality of memory cells connected between a plurality of word lines and a plurality of bit line pairs, wherein the word lines comprise a plurality of sub-word lines; a first row decoder for selecting a first decoded signal line by decoding a first row address in response to an active command; a second row decoder for selecting a second decoded signal line by decoding a second row address in response to the active command; a first decoded signal driver for driving a signal of the first decoded signal line; a sub-word line driver for selecting a sub-word line by combining the second decoded signal and an output signal from the first decoded signal driver; a dummy decoded signal line selection means for selecting a first dummy decoded signal line having a substantially same capacitance as the first decoded signal line in response to a signal which is generated by combining output signals of the second row decoder; a dummy decoded signal driver for driving an output signal from the first decoded signal line selection means; a dummy sub-word line driver for selecting a dummy sub-word line by combining the output signal from the first dummy decoded signal driver and a signal of an second dummy decoded signal line which has substantially the same capacitance as the second decoded signal line; a Schmitt trigger for generating a word line enable detecting signal by receiving a signal from the dummy sub-word line, wherein the Schmitt trigger is connected to a power supply voltage which is the same as the voltage level used to enable the sub-word line.

BRIEF DESCRIPTION OF THE DRAWINGS

For a more complete understanding of the present invention and the advantages thereof, reference is now made to the following descriptions taken in conjunction with the accompanying drawings, in which like reference numerals designate like elements, and in which.

DETAILED DESCRIPTION OF THE INVENTION

Reference will now be made in detail to preferred embodiments of the present invention, examples of which are illustrated in the accompanying drawings. Like reference numbers in all the drawings designate like elements.

Figure 1:
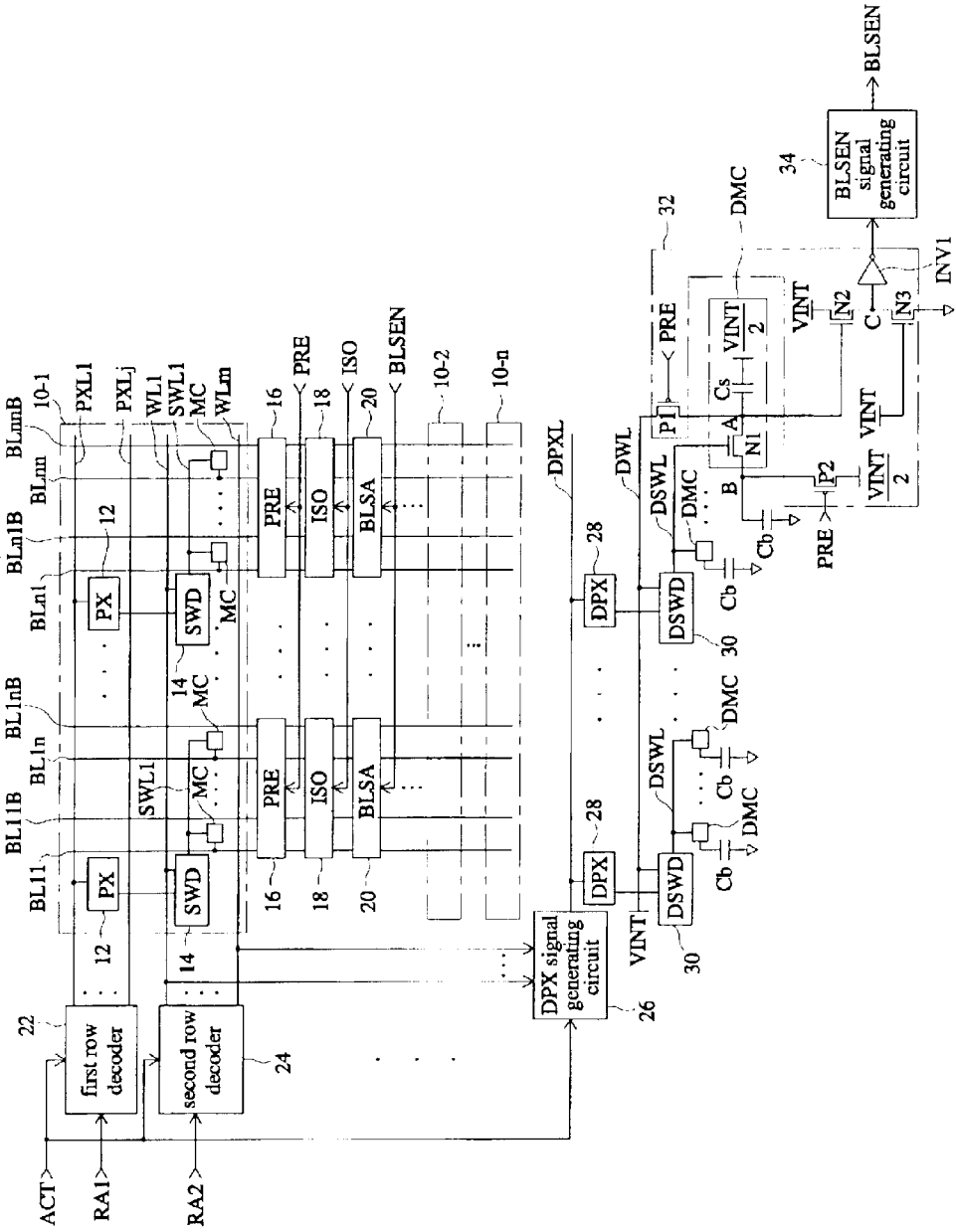
FIG. 1 is a schematic circuit diagram of a bit line sense enable signal generating circuit in a semiconductor memory device in accordance with the conventional art.

FIG. 1 is a conventional semiconductor memory device including a bit line sense enable signal generating circuit in accordance with the conventional art. As shown in FIG. 1, the conventional semiconductor memory device includes a plurality of memory cell array blocks 10-1 to 10-n, a plurality of signal drivers PX 12 corresponding to each of the memory cell array blocks 10-1 to 10-n, a plurality of memory cells MC, a plurality of pre-charge circuits PRE 16, a plurality of bit line isolation circuits ISO 18, a plurality of bit line sense amplifiers BLSA 20, a first row decoder 22, a second row decoder 24, a signal generating circuit 26, a plurality of DPX signal drivers DPX 28, a plurality of dummy sub-word line drivers DSWD 30, a plurality of dummy memory cells DMC, a capacitor $C_b$ having capacitance corresponding to the capacitance of a bit line, a word line enable detecting circuit 32, and a bit line sense enable signal BLSEN generating circuit 34.

As shown in FIG. 1, the conventional semiconductor memory device is configured to have sub-word line structure. The PX signal drivers 12, the sub-word line drivers 14, the pre-charge circuits 16, the bit line isolating circuits 18, the bit line sense amplifiers 20, the DPX signal drivers 28, and the dummy sub-word line drivers are designated also by PX, SWD, PRE, ISO, BLSA, DPX, and DSWD, respectively.

The memory cells MC in each of the memory cell array blocks 10-1, 10-n are connected to the corresponding sub-word line (e.g., SWL1) and the bit lines BL11, . . . , BL1n, . . . , BLn1, . . . , BLnn. The dummy memory cells DMC are connected to the dummy sub-word lines (DSWL). The pre-charge circuits PRE 16, the bit line isolation circuits ISO 18, and the bit line sense amplifiers BLSA 20 are connected between two sets of bit line pairs.

The DPX signal drivers 28, the dummy sub-word line drivers (DSWD) 30, the dummy memory cells DMC, the DPX signal line DPXL, the dummy word line DWL and the dummy sub-word line DSWL formed in a peripheral circuit area are configured to have the same structure as the PX signal drivers 12, the sub-word line drivers 14, the memory cells MC, the PX signal line PXL1, the word line WL1 and the sub-word line SWL1 in the memory cell array block 10-1, respectively.

A capacitor $C_b$ is configured to have a capacitance corresponding to the capacitance of each of the bit lines.

The dummy memory cell DMC comprises a transistor N1, a capacitor Cs and a internal power supply voltage VINT/2 that is half the amount of supply voltage VINT. The word line enable detecting circuit 32 comprises PMOS transistors P1, P2, NMOS transistors N2, N3 and an inverter INV1. The PMOS transistor P1 is a pre-charge transistor for pre-charging a node A, and a PMOS transistor P2 is a pre-charge transistor for pre-charging a node B.

Operation of the conventional semiconductor memory device shown in FIG. 1 to generate a bit line sense enable signal will be described below.

When a pre-charge command PRE is generated, the pre-charge circuits 16 pre-charge the bit line pairs BL11–BL11B, . . . , BL1n–BL1nB . . . , BLn1– BLn1B, . . . , BLnn–BLnnB to the half internal power-supply voltage VINT/2 in response to the pre-charge command PRE and at the same time, pre-charge the node A and the node B to an internal power-supply voltage VINT and the half internal power-supply voltage VINT/2, respectively, by turning on the PMOS transistor P1 and the PMOS transistor P2. Then, the NMOS transistor N2 is turned on, thereby charging the node C. The inverter INV1 detects a voltage level of the node C and generates a signal having a logic "low" level when the voltage level of the node C is greater than a predetermined voltage level. The bit line sense enable signal generating circuit receives the signal having the logic "low" level output from the inverter INV1 and generates a bit line sense enable signal BLSEN by delaying the signal output from the inverter INV1.

When an active command ACT is generated, the first row decoder 22 selects a PX signal line PXL1 by decoding the first row address RA1 and then the second row decoder 24 selects a word line WL1 by decoding the second row address RA2. At this time, the DPX signal generating circuit 26 selects a dummy PX signal line DPXL when one of output signals output from the second row decoder 24 is selected. The PX signal drivers 12 drive a signal of the PX signal line PXL1 and the DPX signal drivers 28 drive a signal of the DPX signal line DPXL. The sub-word line drivers 14 select a sub-word line SWL1 in response to an output signal of the PX signal drivers 12 and a signal of the word line WL1. The dummy sub-word line drivers 30 selects a dummy sub-word line DSWL in response to an output signal of the DPX signal drivers 28.

When the sub-word line is selected, charge sharing between memory cells connected to the selected sub-word line and the bit line pairs BL11–BL11B, . . . , BL1n–BL1nB, . . . , BLn1–BLn1B, . . . , BLnn–BLnnB occurs. When the dummy sub-word line DSWL is selected, the NMOS transistor N1 is turned on and a voltage level at the node A is lowered because electric charges are transmitted from the node A to the node B. The inverter INV1 generates a signal of logic "high" level when a voltage level at the node C is lowered below a predetermined level. The bit line sense enable signal generating circuit 34 generates a bit line sense enable signal BLSEN having a logic "high" level by delaying the output signal of the inverter INV1.

When a voltage difference is generated between a pair of the bit lines BL11–BL11B, . . . , BL1n–BL1nB, . . . , BLn1–BLn1B, . . . , BLnn–BLnnB by the charge sharing operation, a bit line isolation control signal ISO is generated and then it turns on the bit line isolation circuits 18. Then, the sense amplifiers 20 are enabled and amplify the voltage difference generated between the pair of the bit lines BL11–BL11B, . . . , BL1n–BL1nB, . . . , BLn1–BLn1B, . . . , BLnn–BLnnB in response to the logic "high" level of a bit line sense enable signal BLSEN which is generated after the bit line isolation control signal ISO is generated.

In the same way as was discussed above, when one sub-word line SWL1 in the memory cell array 10-1, 10-n is enabled, at the same time the dummy sub-word line DSWL is enabled. After a predetermined time from when the dummy sub-word line is enabled, a bit line sense enable signal BLSEN is generated. Accordingly, the bit line sense enable signal BLSEN having a constant delay time is generated without being affected by the process changes, voltage fluctuations, or the temperature fluctuations.

However, the conventional semiconductor memory device shown in FIG. 1 dominates a large layout area of a semiconductor substrate because all circuits for selecting the sub-word line in the memory cell array are copied in the peripheral circuit area. Furthermore, the copied circuits in the peripheral circuit area have to be repeatedly tested to confirm whether the circuits satisfy desired characteristics.

Figure 2:
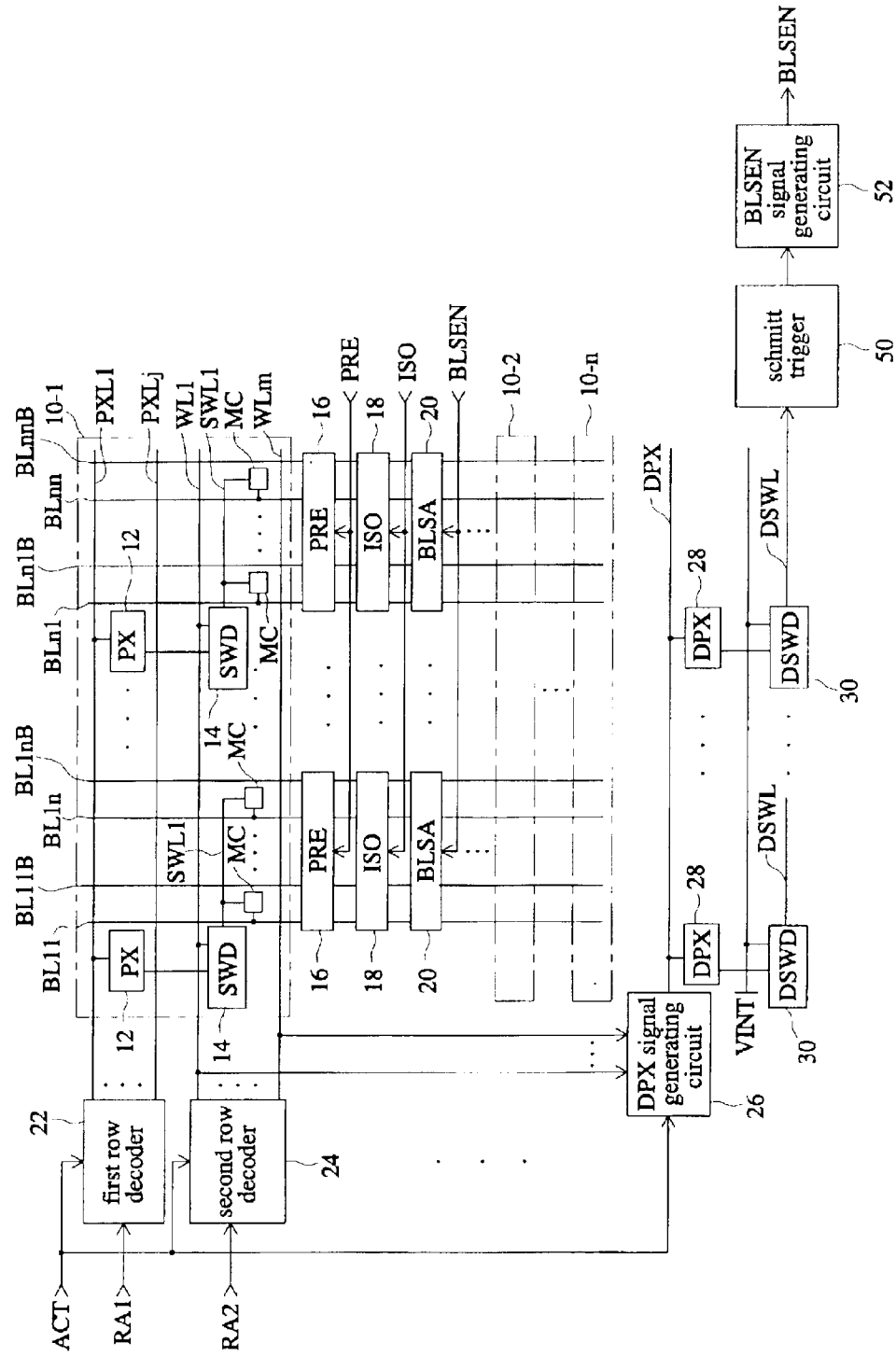
FIG. 2 is a schematic circuit diagram of a bit line sense enable signal generating circuit in a semiconductor memory device in accordance with the present invention.

FIG. 2 is a semiconductor memory device including a bit line sense enable signal generating circuit in accordance with one embodiment of the present invention. As shown in FIG. 2, a Schmitt trigger 50 and a bit line sense enable signal generating circuit 52 are provided instead of the dummy memory cells DMC, the bit line capacitors Cb, the word line enable detecting circuit 32 and the bit line sense enable signal generating circuit 34 of the conventional semiconductor memory device shown in FIG. 1.

As shown in FIG. 2, the semiconductor memory device in accordance with the present invention does not use the dummy memory cells DMC and the bit line capacitor Cb for generating the bit line sense enable signal BLSEN. Accordingly, the layout area of the semiconductor memory device in accordance with the present invention is reduced.

Figure 3:
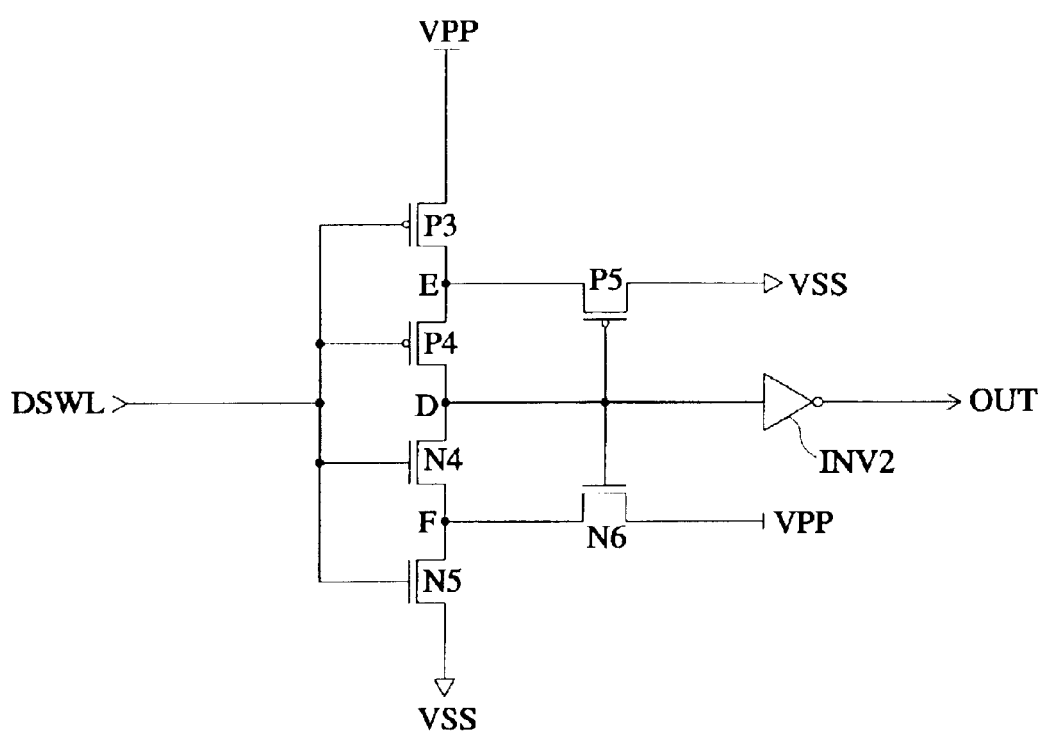
FIG. 3 is an exemplary circuit diagram of a Schmitt trigger shown in FIG. 2 in accordance with the present invention.

FIG. 3 is a circuit diagram showing a Schmitt trigger in accordance with one embodiment of the present invention.

The Schmitt trigger comprises PMOS transistors P3, P4, and P5; NMOS transistors N4, N5, and N6; and an inverter INV2.

The PMOS transistor P3 includes a drain connected to a node E, a gate connected to a dummy sub-word line DSWL, and a source to which high voltage $V_{PP}$ is applied. The PMOS P4 transistor includes a source connected to the node E, a gate connected to the dummy sub-word line DSWL, and a drain connected to a node D. The NMOS transistor N4 includes a drain connected to the node D, a gate connected to the dummy sub-word line DSWL and a source connected to the node F. The NMOS transistor N5 includes a drain connected to a node F, a gate connected to the dummy sub-word line DSWL and a source to which ground voltage VSS is applied. The PMOS transistor P5 includes a source connected to the node E, a gate connected to the node D and a drain to which the ground voltage VSS is applied. The NMOS transistor N6 includes a source connected to the node F, a gate connected to the node D and a drain to which the high voltage $V_{PP}$ is applied. The inverter INV2 inverts a signal at the node D.

A method for generating bit line sense enable signals with the semiconductor memory device in accordance with the present invention will be disclosed below in detail with reference to FIG. 2 and FIG. 3.

When the dummy sub-word line DSWL maintains a logic "low" level, the PMOS transistors P3 and P4 of the Schmitt trigger 50 are turned on and then a high voltage level $V_{PP}$ signal is transmitted to the node D. The inverter INV2 generates a "low" voltage level signal when the voltage level of node D is greater than a predetermined voltage level. At that time, the NMOS transistor N6 is turned on in response to the high voltage level signal at node D and transmits the high voltage $V_{PP}$ to the node F. The bit line sense enable signal generating circuit 52 generates the bit line sense enable signal BLSEN having a logic "low" level by delaying the "low" voltage level signal output from the inverter INV2.

When an active command ACT is created, the first row decoder 22 selects a signal line PXL1 by decoding the first row address RA1 and the second row decoder 24 selects a word line WL1 by decoding the second row address RA2. The PX signal driver 12 drives a signal of the PX signal line PXL1 and the sub-word line driver 14 selects a sub-word line SWL1 by receiving an output signal from the PX signal driver 12 and a signal of the word line WL1. The DPX signal generating circuit 26 selects a dummy signal line DPXL by logically summing output signals from the second row decoder 24. The DPX signal driver 28 drives a signal of the dummy signal line DPXL, and the dummy sub-word line driver 30 selects a dummy sub-word line DSWL by receiving an output signal from the DPX signal driver 28 and a high voltage level signal VINT.

When the sub-word line SWL1 is selected, charge sharing occurs between the memory cells connected to the selected sub-word line SWL1 and the bit line pairs BL11–BL11B, . . . , BL1n–BL1nB, . . . , BLn1–BLn1B, . . . , BLnn–BLnnB. In case of selecting the dummy sub-word line DSWL, the NMOS transistors N4, N5 are turned on and the voltage level of node F becomes equal to the ground voltage. Some delay time for the voltage level at node F to drop to the ground voltage level from the high voltage $V_{PP}$ level is required. As the voltage level at node F drops, the voltage level at node D drops as well. The inverter INV2 detects a voltage level at the node D. After that, the bit line sense enable signal generating circuit 52 generates a bit line sense enable signal BLSEN by delaying the logic "high" level signal output from the inverter INV2 when the voltage level of the node D drops below a predetermined voltage level and generates a logic "high" level signal.

Subsequent operation processes are the same as those described for the conventional art of FIG. 1. Accordingly, additional explanation is omitted for the sake of convenience and brevity.

In accordance with the present invention shown in FIG. 2, the bit line sense enable signal generating circuit is simplified in comparison to the conventional semiconductor device shown in FIG. 1. Accordingly, the present invention can provide a semiconductor device with a smaller relative layout area.

Furthermore, in the present invention, the high voltage level $V_{PP}$ is applied to generate the bit line sense enable signal using a power supply voltage from the Schmitt trigger. Accordingly, testing to confirm whether the bit line sensing enable signal generating circuit is properly operating is not needed.

Even though the embodiment of the present invention depicts the bit line sense enable signal generating circuit, the present invention can be applied to any circuit generating a delayed signal such as an active command which is generated after a predetermined time from a reference signal.

While the invention has been particularly shown and described with reference to preferred embodiments thereof, it will be understood by those skilled in the art that the foregoing and other changes in form and details may be made therein without departing from the spirit and scope of the invention.

We claim:

1. A semiconductor memory device, comprising:
   a word line selection signal generating circuit for generating a word line selection signal for selecting a word line;
   a delay circuit for generating a delayed signal by delaying a reference signal to the same extent of time which is needed for the word line selection signal generating circuit to generate the word line selection signal; and
   a Schmitt trigger for generating a word line enable detecting signal by receiving an output signal from the delay circuit, wherein the Schmitt trigger is connected to a power supply voltage which has the same voltage level as a voltage to enable the word line.

2. The semiconductor memory device according to claim 1, wherein the Schmitt trigger comprises:
   a first PMOS transistor with a gate connected to an output terminal of the delay circuit, a source to which the power supply voltage is applied, and a drain;
   a second PMOS transistor with a gate connected to the output terminal of the delay circuit, a source connected to the drain of the first PMOS transistor and a drain connected to a common node;
   a first NMOS transistor with a gate connected to the output terminal of the delay circuit, a drain connected to the common node and a source;
   a second NMOS transistor with a gate connected to the output terminal of the delay circuit, a drain connected to the source of the first NMOS transistor and a source connected to a ground voltage;
   a third PMOS transistor with a source connected to the drain of the first PMOS transistor, a drain to which the ground voltage is applied and a gate connected to the common node;
   a third NMOS transistor with a source connected to the source of the first NMOS transistor, a drain to which a power supply voltage is applied, and a gate connected to the common node; and
   an inverter for generating the word line enable detecting signal when a voltage level of the common node becomes lower than a predetermined voltage.

3. A semiconductor memory device, comprising:
   a memory cell array including a plurality of memory cells that are connected to a plurality of word lines and a plurality of bit lines;
   decoding means for decoding a row address in response to an active command;
   a word line selection means for selecting a word line from the plurality of word lines in response to an output signal from the decoding means;
   a dummy word line selection means for selecting, in response to the output signal from the decoding means, a dummy word line with substantially the same capacitance as the selected word line, wherein the dummy word line selection means has substantially the same circuit configuration as the word line selection means;
   a Schmitt trigger for generating a word line enable detecting signal by receiving a signal from the selected dummy word line, wherein the Schmitt trigger is connected to a power supply voltage which is the same as a voltage level used to enable the word line.

4. The semiconductor memory device according to claim 3, wherein the Schmitt trigger comprises:
   a first PMOS transistor with a gate connected to the dummy word line, a source to which the power supply voltage is applied, and a drain;
   a second PMOS transistor with a gate connected to the dummy word line, a source connected to the drain of the first PMOS transistor and a drain connected to a common node;
   a first NMOS transistor with a gate connected to the dummy word line, a drain connected to the common node and a source;
   a second NMOS transistor with a gate connected to the dummy word line, a drain connected to the source of the first NMOS transistor and a source connected to a ground voltage;
   a third PMOS transistor with a source connected to the drain of the first PMOS transistor, a drain to which the ground voltage is applied and a gate connected to the common node;
   a third NMOS transistor with a source connected to the source of the first NMOS transistor, a drain to which the power supply voltage is applied and a gate connected to the common node; and
   an inverter for generating the word line enable detecting signal when a voltage level of the common node becomes lower than a predetermined voltage.

5. A semiconductor memory device, comprising:
   a memory cell array including a plurality of memory cells connected to a plurality of word lines and a plurality of bit lines, wherein the word lines comprise a plurality of sub-word lines;
   a first row decoder for selecting a first decoded signal line by decoding a first row address in response to an active command;
   a second row decoder for selecting a second decoded signal line by decoding a second row address in response to the active command;
   a first decoded signal driver for driving a signal from the first decoded signal line;
   a sub-word line driver for selecting a sub-word line by combining the second decoded signal and an output signal from the first decoded signal driver;
   a dummy decoded signal line selection means for selecting, in response to a signal which is generated by combining output signals from the second row decoder, a first dummy decoded signal line with substantially the same capacitance as the first decoded signal line;
   a dummy decoded signal driver for driving an output signal from the first decoded signal line selection means;
   a dummy sub-word line driver for selecting a dummy sub-word line by combining the output signal from the first dummy decoded signal driver and a signal from a second dummy decoded signal line that has substantially the same capacitance as the second decoded signal line;

a Schmitt trigger for generating a word line enable detecting signal by receiving a signal from the dummy sub-word line, wherein the Schmitt trigger is connected to a power supply voltage which is the same as a voltage level used to enable the sub-word line.

6. The semiconductor memory device according to claim 5, wherein the Schmitt trigger includes:

a first PMOS transistor with a gate connected to the dummy word line, a source to which the power supply voltage is applied, and a drain;

a second PMOS transistor with a gate connected to the dummy word line, a source connected to the drain of the first PMOS transistor and a drain connected to a common node;

a first NMOS transistor with a gate connected to the dummy word line, a drain connected to the common node and a source;

a second NMOS transistor with a gate connected to the dummy word line, a drain connected to the source of the first NMOS transistor and a source connected to a ground voltage;

a third PMOS transistor with a source connected to the drain of the first PMOS transistor, a drain to which the ground voltage is applied and a gate connected to the common node;

a third NMOS transistor having a source connected to the source of the first NMOS transistor, a drain to which the power supply voltage is applied, and a gate connected to the common node; and an inverter for generating the word line enable detecting signal when a voltage level of the common node becomes lower than a predetermined voltage level.

* * * * *